(12) United States Patent
Fournel et al.

(10) Patent No.: US 8,207,048 B2
(45) Date of Patent: Jun. 26, 2012

(54) METHOD FOR PRODUCING ORDERED NANOSTRUCTURES

(75) Inventors: Franck Fournel, Villard Bonnot (FR); Hubert Moriceau, Saint Egreve (FR); Chrystel Deguet, Saint Ismier (FR)

(73) Assignee: Commissariat a l'Energie Atomique, Paris (FR)

( * ) Notice: Subject to any disclaimer, the term of this patent is extended or adjusted under 35 U.S.C. 154(b) by 1372 days.

(21) Appl. No.: 11/612,829

(22) Filed: Dec. 19, 2006

(65) Prior Publication Data
US 2007/0228378 A1 Oct. 4, 2007

(30) Foreign Application Priority Data
Dec. 27, 2005 (FR) ...................................... 05 54108

(51) Int. Cl.
*H01L 21/30* (2006.01)
*H01L 21/46* (2006.01)

(52) U.S. Cl. .......... 438/459; 438/310; 438/58; 438/143; 438/473; 438/474; 438/476; 438/477; 257/E21.318; 257/E21.321

(58) Field of Classification Search .................. None
See application file for complete search history.

(56) References Cited

U.S. PATENT DOCUMENTS

| | | | | |
|---|---|---|---|---|
| 5,755,914 | A * | 5/1998 | Yonehara | 156/281 |
| 6,261,928 | B1 * | 7/2001 | Bruel | 438/459 |
| 6,724,017 | B2 * | 4/2004 | Semeria et al. | 257/183 |
| 7,041,227 | B2 * | 5/2006 | Fournel et al. | 216/33 |
| 7,166,520 | B1 * | 1/2007 | Henley | 438/458 |
| 2003/0010971 | A1 * | 1/2003 | Zhang et al. | 257/15 |
| 2004/0014299 | A1 * | 1/2004 | Moriceau et al. | 438/459 |
| 2004/0074866 | A1 | 4/2004 | Fournel et al. | |
| 2005/0067666 | A1 * | 3/2005 | Robert | 257/415 |
| 2005/0101095 | A1 * | 5/2005 | Fournel et al. | 438/305 |

FOREIGN PATENT DOCUMENTS

| | | | |
|---|---|---|---|
| FR | 2 766 620 A1 | | 1/1999 |
| JP | 11112099 | * | 4/1999 |
| WO | WO 02/29876 A1 | | 4/2002 |
| WO | WO 02/054466 A1 | | 7/2002 |

OTHER PUBLICATIONS

Bumm and Johnson (Nano-Scale Structure Fabricated using Anodic Aluminum Oxide Templates), Feb. 22, 2005.*

* cited by examiner

*Primary Examiner* — David Vu
*Assistant Examiner* — Mohammad Choudhry
(74) *Attorney, Agent, or Firm* — Oblon, Spivak, McClelland, Maier & Neustadt, L.L.P.

(57) ABSTRACT

Method for producing nanostructures comprising:
a step of providing a substrate (100) having a buried barrier layer (2) and above said barrier layer (2) a crystalline film (5) provided with a network of crystalline defects and/or stress fields (12) in a crystalline zone (13),
one or several steps of attacking the substrate (100), of which a preferential attack either of the crystalline defects and/or the stress fields, or the crystalline zone (13) between the crystalline defects and/or the stress fields, said attack steps enabling the barrier layer (2) to be laid bared locally and protrusions (7) to be formed on a nanometric scale, separated from each other by hollows (7.1) having a base located in the barrier layer, the protrusions leading to nanostructures (7, 8).

16 Claims, 10 Drawing Sheets

METHOD FOR PRODUCING ORDERED NANOSTRUCTURES

TECHNICAL FIELD

The present invention relates to the manufacture of ordered nanostructures. Said nanostructures may be used for example in microelectronics, optoelectronics or in biology. In particular, this type of nanostructures enables networks of quantum dots or Coulomb block electronic devices or instead light emitting devices to be formed.

STATE OF THE PRIOR ART

Methods for forming a periodic nanostructuring on the surface of a substrate, formed from an alternation of protrusions and hollows, are known from patent applications FR-A-2 766 620 and FR-A-2 815 121. This nanostructuring is formed from a network of crystalline defects and/or stress fields obtained at the interface between two crystalline faces of substrates assembled one against the other. The teaching of these two patent applications may be combined with chat of patent application FR-A-2 819 099, which enables the periodicity of the nanostructuring and thereby the density of the protrusions and the hollows to be controlled with high control in a precise manner the lateral dimensions of the protrusions, their height and their shape and to do his in a homogeneous manner at one scale of the substrate, typically 300 millimetres and more. However, for certain applications, such as for example quantum dots, it is necessary to perfectly control at least some of these parameters.

DESCRIPTION OF THE INVENTION

The aim of the present invention is to propose a method for producing ordered nanostructures on a substrate, said nanostructures having determined and homogeneous dimensions and location at the scale of the substrate.

More precisely, the present invention is a method for producing nanostructures comprising:
  a step of providing a substrate having a buried barrier layer and above said barrier layer a crystalline film provided with a network of crystalline defects and/or stress fields and a crystalline zone between the crystalline defects and/or the stress fields,
  one or several steps of attacking the substrate, of which a preferential attack either of the crystalline defects and/or stress fields, or of the crystalline zone between the crystalline defects and/or the stress fields, said attack steps enabling the barrier layer to be laid bare locally and protrusions to be formed on a nanometric scale, separated from each other by hollows having a base situated at the level of the barrier layer, the protrusions leading to nanostructures.

Film is taken to mean a layer, the thickness of which is less than 1 micrometre.

It is possible that the substrate is obtained by using the following steps:
  a step of bonding by molecular adhesion a crystalline face of a first intermediate substrate and a crystalline face of a second intermediate substrate, said first intermediate substrate comprising a barrier layer placed under a film, the crystalline face of the first intermediate substrate being that of the film, the bonding being carried out in such a way that the faces have offset crystalline networks, and that a network of crystalline defects and/or stress fields forms in a crystalline zone in the vicinity of the interface,
  a step of thinning the second intermediate substrate.

Alternatively, it is possible to obtain the structure by transferring, onto an intermediate substrate provided with the barrier layer, a crystalline film comprising such a network of crystalline defects and/or stress fields.

In a particularly simple embodiment, the protrusions may materialise the nanostructures.

Alternatively, in order to increase the height of the nanostructures, one may carry out a complementary treatment aiming to etch at least the barrier layer of the substrate, the protrusions serving as mask during this treatment, the nanostructures being materialised at least by segments directly in line with the protrusions, etched in the barrier layer of the substrate, obtained during the complementary treatment.

One may provide for covering the protrusions with a material capable of reinforcing the resistance of the protrusions during the complementary treatment.

When the substrate comprises a base underlying the barrier layer, the etching of the complementary treatment may be stopped by the base, which makes it possible to control the height of the nanostructures In another embodiment, one may carry out, in addition, a supplementary treatment aiming to etch the base underlying the barrier layer of the substrate, the segments in the barrier layer in the substrate, and/or the protrusions serving as mask, the nanostructures being materialised at least by segments, directly in line with the segments in the barrier layer, etched in the base, obtained during the supplementary treatment.

An additional layer may be inserted between the base and the barrier layer of the substrate; one may then carry out, in addition, an additional treatment aiming to etch the additional layer, the segments and/or the protrusions in the barrier layer that can serve as mask, the nanostructures being materialised at least by segments directly in line with the segments in the barrier layer, etched in the additional layer, obtained during the additional treatment.

The etching of the additional treatment may be stopped by the base of the substrate, which further enables the height of the nanostructures to be controlled.

The base of the substrate may be multilayer and comprise a barrier layer underlying the additional layer.

One may provide for a step of eliminating the protrusions, which enables the summits of the nanostructures to be included in a same plane.

One may further provide for a step of eliminating the segments etched in the barrier layer of the substrate to only conserve the underlying segments.

The additional layer may be formed in crystalline semiconductor material.

The attacks and/or the complementary treatment and/or the supplementary treatment and/or the additional treatment may be chosen among dry or wet chemical, ionic, electrochemical, photochemical or thermal etching, under oxidising or reducing atmosphere.

One may provide that at least one attack or treatment step is an anisotropic etching so as to facet the nanostructures.

One may provide that at least one attack or treatment step has a different rate of attack, depending on the material brought into play. The attack may for example have a very low rate in the barrier layer compared to that which exists at the level of the protrusions, in order to adjust the lateral dimensions of the protrusions.

One may provide that at least one attack or treatment step is an anisotropic etching so as to transfer the relief of the protrusions already created.

One may use as first intermediate substrate and as second intermediate substrate, semi-conductor on insulator substrates each having a semi-conductor film removed from a same block of crystalline semi-conductor material, the crystalline faces of the intermediate substrates being those of films.

The removal can take place for one of the semi-conductor on insulator substrates:
- by forming an oxide layer on the surface of the block,
- by creating an embrittled zone within the block under the layer of oxide by ion implantation,
- by assembling the block by its layer of oxide to an auxiliary substrate,
- by provoking a fracture at the level of the embrittled zone, the material found between the layer of oxide and the embrittled zone forming the film of the substrate, the remainder of the block forming a remaining element.

For the other semi-conductor on insulator substrate, the removal may take place:
- by forming an oxide layer on the surface of the remaining element,
- by creating another embrittled zone within the remaining element under the layer of oxide by ion implantation,
- by assembling the remaining element by its layer of oxide to another auxiliary substrate,
- by provoking a fracture at the level of the other embrittled zone, the material found between the layer of oxide and the other embrittled zone forming the film of the other semi-conductor on insulator substrate.

In order to improve the precision of the location of the network of crystalline defects and/or stress fields, one may etch locating marks in the block before its assembly to the auxiliary substrate, said marks extending beyond the embrittled zone until they reach the other embrittled zone, said locating marks facilitating the offset of the crystalline networks.

In order to avoid a flexing disorientation, one may turn one of the faces 180° in relation to the other by means of locating marks before introducing the offset of the crystalline networks.

Alternatively, the first semi-conductor on insulator may be a double semi-conductor on insulator substrate, its auxiliary substrate being a semi-conductor on insulator substrate with an insulator layer, inserted between a layer and a film in semi-conductor material, characterised in that it consists in assembling the film of the auxiliary substrate to the layer of oxide.

BRIEF DESCRIPTION OF DRAWINGS

The present invention will be more fully understood on reading the description of embodiments given solely by way of indication and in nowise limitative, and by referring to the appended drawings in which.

Figure 1A:
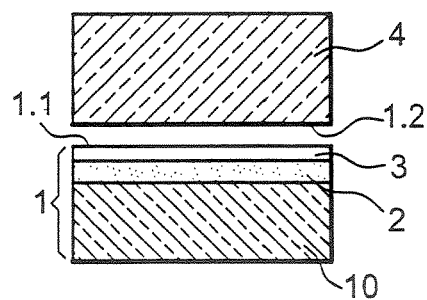
FIGS. 1A to 1E show different steps of an example of the method according to the invention.
Figure 1B:
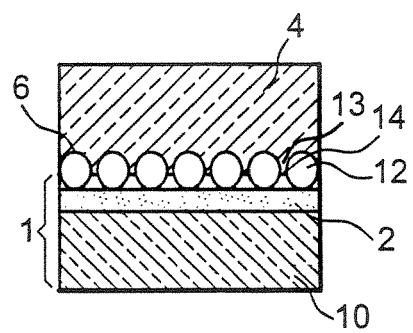

Identical, similar or equivalent parts in the different figures described hereafter bear the same numerical references so as to facilitate going from one figure to another.

In order to make the figures easier to read, the different parts represented in the figures are not necessarily to a uniform scale.

DETAILED DESCRIPTION OF SPECIFIC EMBODIMENTS

We will now, in referring to FIGS. 1A to 1E, detail a first example of a method for producing nanostructures on a substrate according to the invention.

One begins with a first intermediate substrate 1 comprising a crystalline face 1.1 formed by a film 3 in crystalline semi-conductor material covering a barrier layer 2 and a second intermediate substrate 4 comprising a crystalline face 1.2. The first intermediate substrate 1 may be, in this example, a semi-conductor on insulator substrate with a base 10 and the film 3, for example in silicon, and between the two, a layer in insulator material, for example in silicon oxide, the layer in insulator material serving as barrier layer 2 to the etching.

The second intermediate substrate 4 may be in silicon. Advantageously, it may comprise a buried barrier layer to facilitate its subsequent thinning. This may be for example a SOI (silicon on insulator) substrate.

More generally, the base 10 and the film 3 of the firs intermediate substrate 1, the second intermediate substrate 4 may be in silicon, in germanium, in gallium arsenide GaAs, in silicon carbide SiC, in indium phosphide InP. The barrier layer 2 for its part may, for example, be in silicon oxide, in silicon nitride, in amorphous silicon.

It is possible that the base 10 and the film 3 of the first intermediate substrate 1, the second intermediate substrate 4 and the barrier layer 2 are multilayer.

One may refer to FIG. 1A.

One is going to bond by molecular adhesion the two crystalline faces 1.1 and 1.2 of the two intermediate substrates 1 and 4. This adhesion is carried out in such a way that their crystalline networks are offset by a predetermined angle known hereafter as the offset angle. This offset angle is not visible in FIG. 1, but one may refer to patent applications FR-A-2 815 121, FR-A-2 766 620 and even patent application FR-A-2 819 099, which explain the manner in which to proceed and the consequences of this bonding.

The bonding enables the crystalline networks present on the two faces 1.1 and 1.2 to be connected and provokes the formation of a network of crystalline defects and/or stress fields 2 within a crystalline zone 13 in the vicinity of the bonding interface 14. One notices that crystalline defects, for example dislocations, appear at the interface 14 and they lead to stressed zones in the vicinity of this interface 14. One may refer to FIG. 1B.

Figure 1C:
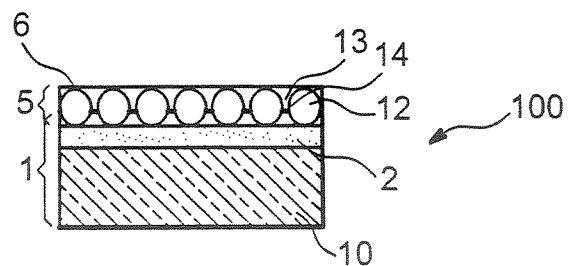

One is then going to thin the second intermediate substrate 4 from its other face, this thinning may lead or not to a surface nanostructuring revealing the presence of the network of crystalline defects and/or stress fields 12. Indeed, the aim of this thinning is to form the film 5 that limits the thickness of the crystalline zone 13 within which is found the network of crystalline defects and/or stress fields 12. This crystalline zone 13 has a thickness that is the sum of the thickness of the film 3 of the first intermediate substrate 1 and that of the film 5 stemming from the second intermediate substrate 4. The substrate 100 obtained at this stage is illustrated in FIG. 1C. In this case, the network of crystalline defects and/or stress fields 12 is not revealed at the surface.

The thinning may be carried out for example by rectification, by mechanical abrasion and/or even by chemical attack.

Alternatively, as illustrated in FIG. 6 described previously, it would be possible to dispose of the substrate 100 by transferring onto a support 101 covered with a layer 102 that will serve subsequently as barrier layer to the etching a film 103 including this network of crystalline defects and/or stress fields. This film 103 may be obtained by following the teaching of patent applications FR-A-2 766 620 or FR-A-2 815 121.

Figure 1D:
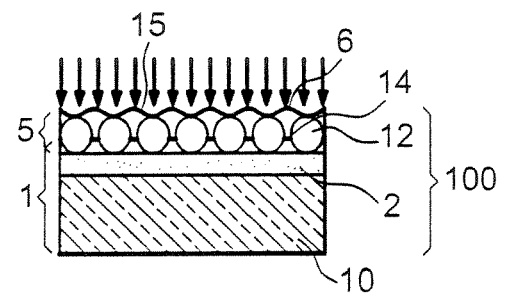

The following step consists in carrying out at least one preferential attack of the free face of the substrate 100 so as to make reliefs 15 appear. Preferential attack, also called selective attack, is taken to mean an etching attacking principally the crystalline defects and/or the stress fields 12, compared to the crystalline zone 13 situated between the crystalline defects and/or the stress fields or reciprocally attacking principally the crystalline zone 13 compared to the crystalline defects and/or stress fields 12. In FIG. 1D, one assumes that it is the crystalline defects and/or the stress fields 12 that are etched preferentially compared to the crystalline zone 13. The inverse could have been possible. The free surface of the treated substrate 100 now bears a network of reliefs 6, the pattern or the surface topology of which depends on the network of crystalline defects and/or stress fields 12 as may be seen in FIG. 1D.

One continues the etching up to making the barrier layer 2 appear locally. This etching is not necessarily preferential vis-á-vis the crystalline defects and/or stress fields 12. If it is preferential, it accentuates the reliefs 6. The barrier layer 2 may not be attacked or only be partially attacked, at this step, hence its name of barrier layer, it is then only laid bare locally. One thereby obtains above the barrier layer 2, the protrusions 7 separated from each other by hollows 7.1 having a base located at the level of the barrier layer 2. The protrusions 7 localise the nanostructures. They lead to the nanostructures, in other words they materialise or contribute to materialising the nanostructures. The protrusions 7 are in crystalline material.

These protrusions 7 are arranged in a network, their distribution is ordered on the surface of the barrier layer 2. The protrusions 7 follow the pattern of the network of crystalline defects and/or stress field or even its complement, this depends on whether the preferential attack concerned the network of crystalline defects and/or stress fields 12 or the neighboring crystalline zone 13. The section of nanostructures that is going to be obtained, depends on the pitch of the network if crystalline defects and/or stress fields 12 and the rate of lateral attack of the etching techniques used.

Figure 1E:
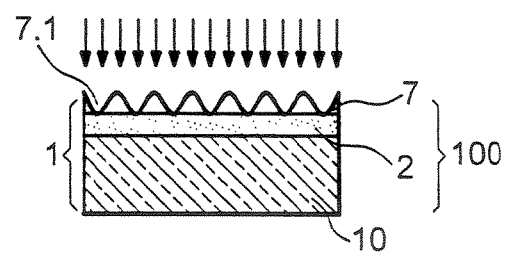

In the example of FIG. 1, the protrusions 7 materialise the nanostructures 7 as illustrated in FIG. 1E.

The attack, whether preferential or non preferential, may be dry or wet, chemical, ionic, electrochemical, photochemical or thermal attack, under reducing or oxidising atmosphere. By thermal attack, one encompasses thermal oxidation. In said attack, the material to be attacked is consumed by being transformed into oxide. Several techniques of successive and/or simultaneous attacks chosen among those evoked above may be employed between the stage represented in FIG. 1C and that represented in FIG. 1E. One or several of these attacks may be non preferential, this may be the case to pass from the stage of FIG. 1D to that of FIG. 1E. One or several attacks may be anisotropic attacks, in the case where one aims in particular to thin in an anisotropic manner the thickness of the films 5 and 3. One or several of these attacks may be anisotropic attacks, in the case where one aims in particular to etch certain crystalline planes and not others. This leads to forming nanostructures 7 with one or several facets. One assumes that in FIG. 1E, the nanostructures 7 are faceted. Advantageously, certain of these attacks can lead to different rates of etching depending on the nature of the layers encountered. The more one approaches the barrier layer 2, the more one will be advised to employ a method having a much lower rate of etching in the barrier layer 2 than in the layer to be etched. The attack may for example have a very low rate in the barrier layer compared to that which exists at the level of the protrusions to adjust the lateral dimensions of the protrusions. One could thus adjust the width of the protrusions 7, by choosing an attack that only slightly affects the barrier layer 2 and favoring the etching of the protrusions 7, particularly the lateral etching.

At the end of the different attack operations that have just been carried out, it is possible that the protrusions 7 are not directly the nanostructures that one aims to obtain, because their height is not sufficient and/or because they do not all have the same height and/or because the summits of all the protrusions are not included in a plane. We will look at different ways of altering them, lengthening them or transforming them. In this case, the protrusions 7 contribute only to materialising the nanostructures.

Figure 2A:
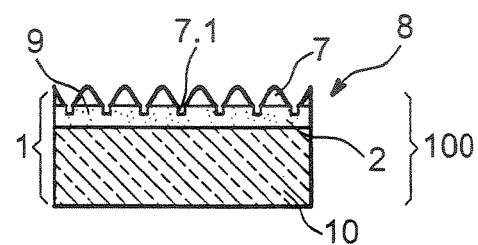
FIGS. 2A to 2E illustrate complementary steps to be carried out following the previous steps to obtain nanostructures in which the summits are included in a same plane.

It is possible to carry out a complementary treatment aiming to etch the barrier layer 2 by using the protrusions 7 as mask. Thus the barrier layer 2 undergoes preferentially the etching and the protrusions 7 are not or are hardly affected. One could if necessary deposit at the level of the protrusions 7 a material capable of reinforcing the resistance of the protrusions vis-á-vis the complementary treatment as will be described later. The etching may not totally cross through the barrier layer 2 as illustrated in FIG. 2A. In this configuration the nanostructures, now referenced 8, being extended by segments 9 in the barrier layer 2, have an increased height compared to that which they had in FIG. 1E.

Figure 2B:
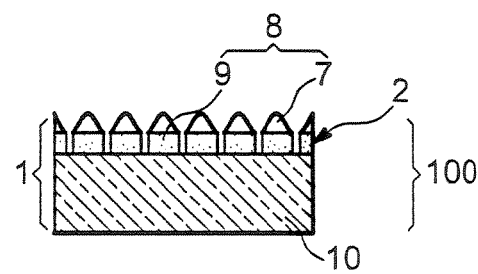

Alternatively, it is possible to continue the complementary treatment so as to completely pass through the thickness of the barrier layer 2. The base 10 of the first intermediate substrate 1 may then have a role of barrier layer for the complementary treatment. This alternative is illustrated in FIG. 2B.

In these two cases, the nanostructures 8 are columnar and each then comprises, in addition to a protrusion 7 stemming from the films 5 and 3, the segment 9, directly in line with it, in the material of the barrier layer 2.

The complementary treatment may be chosen among one or several of the following dry or humid attacks: ionic, chemical, electrochemical, photochemical, under oxidising or reducing atmosphere. If several attacks are employed, they may be employed simultaneously or successively. It should be noted that the complementary treatment attacks preferentially the barrier layer 2 rather than the protrusions 7, or the base 10 of the first intermediate substrate 1, if said first intermediate substrate has a role of barrier layer.

Figure 2C:
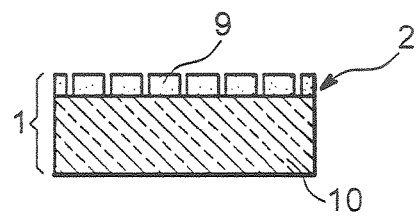

It is possible to level off the nanostructures 8 obtained by eliminating, totally or partially, the protrusions 7 as illustrated in FIG. 2C. This elimination may be carried out by dry or wet ionic, chemical, electrochemical or photochemical attack, under oxidising or reducing atmosphere. The method employed must not attack the material of the barrier layer 2. For example if the protrusions are in silicon and the barrier layer is in silicon oxide or in silicon nitride, the elimination of the protrusions may be achieved with TMAH (tetra methyl ammonium hydroxide) or KOH (potassium hydroxide). This elimination leads to transforming the nanostructures 8 in such a way that their summit is levelled off. If the complementary attack aims at stopping on the base 10 and the levelling attack is selective vis-á-vis the base 10, the height of the nanostructures 8 is equal to the thickness of the barrier layer 2.

Figure 2D:
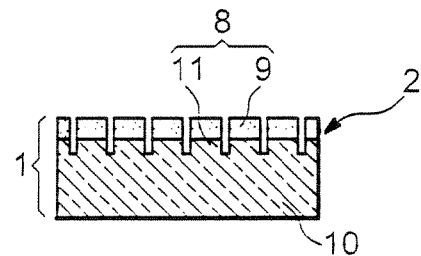

To further increase the height of the nanostructures and/or to change the material and/or to adjust their height and/or so that their summits are all in a same plane, it is possible to undertake a supplementary treatment that affects the base 10 and that aims to etch it. The protrusions 7 may ba present and serve as a mask for this new supplementary treatment or have already been eliminated as illustrated in FIG. 2C. In this configuration, one uses the barrier layer as a mask. This case is illustrated in FIG. 2D.

The nanostructures 8 obtained then comprise at this stage, from their base, a second segment 11, located in the base 10 of the first intermediate substrate 1, directly in line with the protrusions, extended by the first segment 9 located in the barrier layer 2 and, if appropriate, by the protrusions 7 if they have not been removed.

Figure 2E:
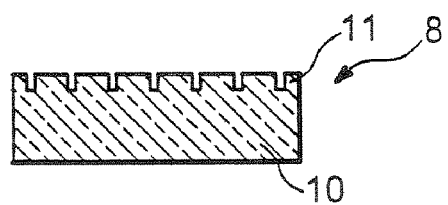

At this stage, it is possible to remove the first segments 9, stemming from the barrier layer 2, by an appropriate elimination treatment to only conserve the second segments 11. In this example illustrated in FIG. 2E, the advantage of only conserving the second segments 11 is that they are formed in a crystalline material and that, in addition, all of the nanostructures 8 then have their summit located in a same plane. Indeed, the summit of these nanostructures has not been exposed directly to an attack of the material that constitutes them since the summits of said second segments 11 have been protected until now by the barrier layer 2. Obviously, if the protrusions 7 have not been removed beforehand, they are removed with the first segments 9.

Figure 3A:
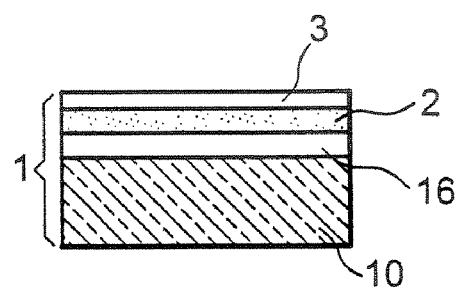
FIGS. 3A to 3D illustrate different steps of the method according to the invention in which the nanostructures have a substantially constant height.
Figure 3B:
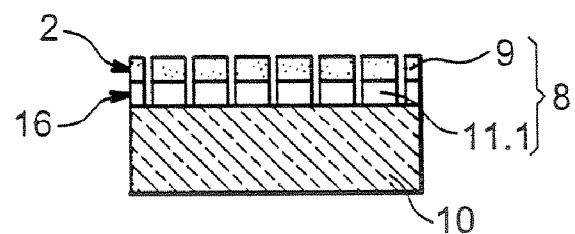
Figure 3C:
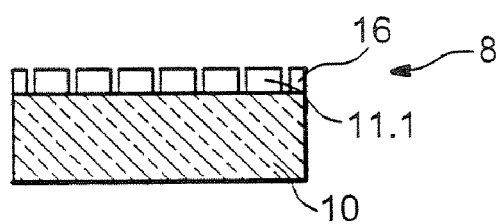

To give the nanostructures a same height, it is possible to use a first intermediate substrate 1 that comprises an additional layer 16 between the base 10 and the barrier layer 2 as illustrated in FIG. 3A. This additional layer 16 may be in germanium or in crystalline silicon for example. With said first intermediate substrate 1, one may proceed in the same way as illustrated in FIGS. 1 and 2, by carrying out an additional treatment aiming to etch the additional layer 16 instead of etching the base 10. The additional treatment uses the barrier layer 2 as mask and the base 10 as layer known as barrier layer. One may refer to FIG. 3B. One assumes in this example that the protrusions have been removed before etching the additional layer 16, which is why they are not visible. Obviously, it would have been possible to conserve them. At this stage the nanostructures 8 are each formed of a first segment 9 formed in the barrier layer 2 and a second segment 11.1 formed in the additional layer 16. Since the etching stops on the base 10, the height of all the nanostructures 8 is substantially constant once the protrusions and the first segments 9 that are fragments of the barrier layer 2, are removed. This height corresponds to the thickness of the additional layer 16. The nanostructures 8 are then formed, entirely, in the material of the additional layer 16. Their summits are substantially included in a same plane. This alternative is illustrated in FIG. 3C. By proceeding in this way, one perfectly controls the height of the nanostructures 8.

If the barrier layer 2 is in silicon oxide and the additional layer 16 in silicon, the elimination of the barrier layer 2 may be carried out by means of hydrofluoric acid HF, which does not attack silicon but dissolves its oxide.

One may envisage that the base 10 is multilayer and comprises a barrier layer underlying the additional layer 16. One may refer for example to FIG. 5H in which the base is formed of the stacking of the layer 301 in silicon and the layer 302 in silicon nitride, the layer 302 in silicon nitride forming the barrier layer underlying the layer 303 that is in silicon.

Figure 3D:
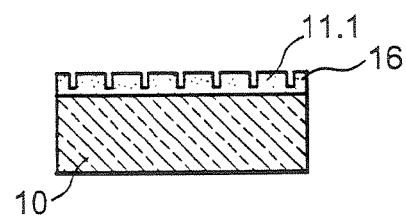

It is obviously possible to stop the etching before reaching the base 10 in the same way as explained in FIG. 2A. In this case, the nanostructures 8 correspond to the second segments 11.1 that are etched in the material of the additional layer 16 as illustrated in FIG. 3D but this configuration is not necessarily optimal since the nanostructures will not necessarily have the same height. In this configuration, one conserves the advantage, which is that the summit of all the nanostructures is included in a same plane.

We will now describe in detail another example of a method for producing nanostructures according to the invention while referring to FIGS. 4A to 4K. In this example, one is going to form two intermediate semi-conductor on insulator substrates as first and second intermediate substrate. It will be recalled that a semi-conductor on insulator type substrate, known by the designation SOI if silicon on insulator, comprises two layers of semi-conductor material located on either side of a layer of insulator. One of the layers of semi-conductor is less thick than the other. In the following description, the least thick layer is designated film. The films of the two SOI substrates are going to stem from a same monocrystal or block of crystalline semi-conductor material. One is going to assemble the two intermediate semi-conductor on insulator substrates with a very precise offset angle by following the teaching of patent application FR-A-2 819 099. This method enables only one angular torsion disorientation and no angular flexion disorientation to be introduced.

Figure 4A:
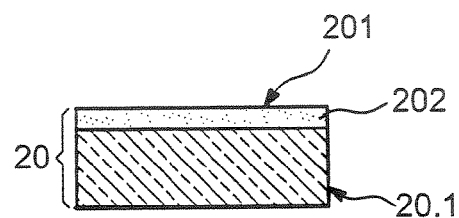
FIGS. 4A to 4L illustrate different steps of the method according to the invention in which one works two semi-conductor on insulator substrates having semi-conductor films stemming from a same block of semi-conductor material, the block being illustrated in FIG. 4L.

One begins with a block 20 of crystalline semi-conductor material, for example of silicon having a free face 201 oriented in the direction <001>. Said block may be a wafer of silicon of 100 millimetres diameter for example having a flat spot 20.1 on one of its edges. In the example, this block 20 is solid but alternatively it could be multilayer and have at the surface a layer of semi-conductor material from which one has removed the two films necessary to obtain the network of crystalline defects and/or stress fields. One is going to work this block 20 so as to be able to remove from it two elements, having crystalline surfaces that will be subsequently bonded one to the other. One may commence by forming an oxide layer 202 by thermally oxidising the free face 201 of the block 20. This layer of oxide 202 may have a thickness of around 400 nanometres. It is going to form the insulator layer of the future SOI substrate. This step is illustrated in FIG. 4A.

Figure 4B:
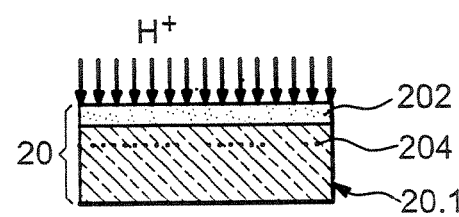

One is then going to embrittle a zone of the block 20 by means of implanted ions, for example hydrogen ions or any other gaseous species capable of forming a buried embrittled zone 204 at the level of which a fracture could occur. The embrittlement zone 204 illustrated FIG. 4B is going to take the shape of a plane located in the silicon of the block 20 under the layer of oxide 202. The implantation takes place from the free surface of the layer of oxide 202. The implantation energy may be around 76 keV and the dose of hydrogen ions may be around $6.10^{16}$ atoms/cm$^2$.

One then forms one or several locating marks 205, for example by photolithography and ionic or other etching in the layer of oxide 202 and in the underlying semi-conductor of the block 20, said locating marks 205 encroaching on the block 20 beyond the embrittlement zone 204 compared to the layer of oxide 202. Their depth may be around 5 micrometres. Other methods of etching these locating marks may be used, for example chemical or laser. The locating marks 205 could alternatively completely pass through the block 20. One may refer to FIG. 4C, which illustrates these locating marks 205 and also FIG. 4K, which shows a top view of the block 20 with its flat spot 20.1 and its locating marks 205. These locating marks may be configured as explained in patent application FR-A-2 819 099 and take the form of scales in the arc of a circle, graduated every 0.01°, at 10 millimetres from the edge of the block 20. One provides for example two locating marks 205 diametrically opposite on the block 20, they extend more or less 10° on either side of the positions 0° and 180°.

Figure 4C:
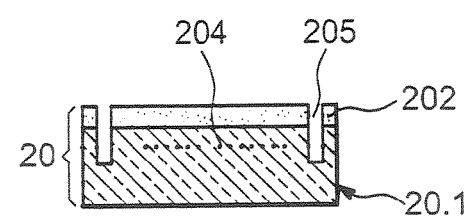
Figure 4D:
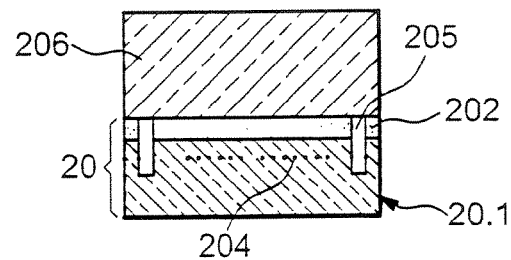

One then assembles, in FIG. 4D, the structure of FIG. 4C on a first auxiliary substrate 206 in semi-conductor material, for example in silicon. This assembly is carried out by the face bearing the layer of oxide 202. The method of assembly may be a hydrophilic molecular bonding. One then provokes in FIG. 4E a fracture along the pane of the embrittled zone 204, for example, by a thermal and/or mechanical treatment. The thermal treatment may take place for one hour at 500° C. for example. This thermal treatment has the advantage of reinforcing the molecular adhesion.

Figure 4E:
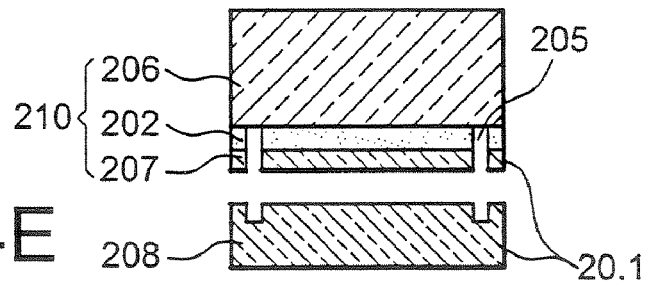

One is in the presence of two elements 210, 208 as illustrated in FIG. 4E. One of the elements 210 is a semi-conductor on insulator substrate, it is formed from the first auxiliary substrate 206, the layer of oxide 202 and a film of silicon 207 taken from the base block 20 by means of the fracture. It is known hereafter as the first intermediate semi-conductor on insulator substrate 210, it is kept as is. The other element 208 is solid in our example, it corresponds to what remains of the block 20, it is designated remaining element. The two elements 208, 210 are equipped with locating marks 205 and comprise a crystalline part 207, 208, which stems from the block 20. The remaining element 208 is going to be worked to lead to a second intermediate semi-conductor on insulator substrate.

The remaining element 208 is subjected to a polishing treatment to level off its locating marks 205 without obviously making them disappear. One forms an oxide layer 209 on the face of the element 208 on the side of the locating marks 205. One may give it a thickness of around 100 nanometres.

One is then going to form a zone of embrittlement 211 within the semi-conductor material of the remaining element 208 by ion implantation, for example with hydrogen ions, as explained in FIG. 4B. The implantation energy may be around 76 keV and the dose of hydrogen may be around $6.10^{16}$ atoms/cm$^2$. The structure of FIG. 4F illustrates the embrittlement zone 211 and the layer of oxide 209.

Figure 4F:
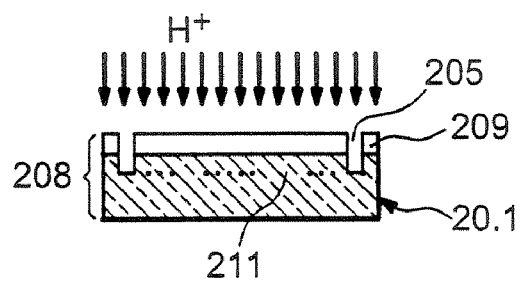
Figure 4G:
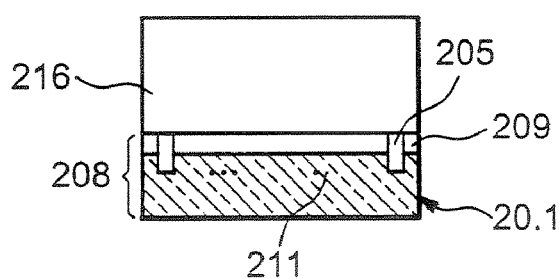

One then assembles, in FIG. 4G, the structure of FIG. 4F on a second auxiliary substrate 216 in semi-conductor material, for example in silicon. This assembly takes place by the face bearing the layer of oxide 209. The assembly method may be a hydrophoic molecular bonding. One then provokes in FIG. 4H a fracture along the plane of the embrittled zone 211, for example, by a thermal treatment for example at 500° C. for one hour. This thermal treatment has the advantage of reinforcing the molecular adhesion.

Figure 4H:
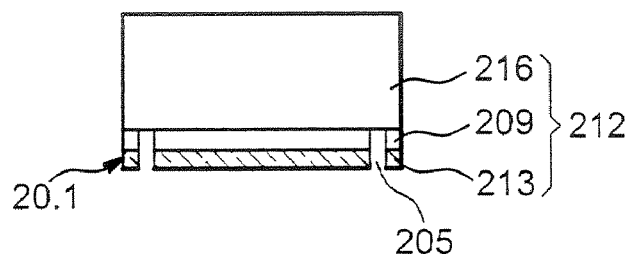

One is in the presence of two elements, only one 212 of which is illustrated in FIG. 4H. This is the second intermediate semi-conductor on insulator substrate 212, it is formed of the second auxiliary substrate 216, the layer of oxide 209 and a film 213 of silicon taken from the remaining element 208 by means of the fracture. This remaining element 208 has also been taken from the block 20. In conclusion, one is indeed in the presence of two intermediate semi-conductor on insulator substrates 210, 212 each having a film 207, 213 taken from the block 20. In addition, these two films 213, 207 are provided with locating marks 205.

One is then going to assemble the two intermediate semi-conductor on insulator substrates 210, 212 by their films 213, 207 with a molecular bonding so as to generate the network of crystalline defects and/or stress fields. It is preferable to prepare the two free crystalline faces of the two films 207, 213 to be able to carry out a hydrophobic molecular bonding. This preparation may comprise all or part of the following treatments: grinding, thermal oxidation, deoxidising, mechanical-chemical polishing, chemical cleaning for example by means of aqueous solutions based on $H_2SO_4$ and $H_2O_2$ or based on $NH_3$ and $H_2O_2$, treatment by means of ozone or plasma (for example oxygen plasma), treatment to render the surface hydrophobic with hydrofluoric acid for example. The preparation may also include a thinning of at least one of the two films 207, 213 to around 100 nanometres.

Before the bonding, one aligns the two flat spots 20.1, with which the two intermediate semi-conductor on insulator substrates 210, 212 are provided. One brings one of the two intermediate semi-conductor on insulator substrates 210, 212, for example the second intermediate substrate 212, in rotation over 180° and one aligns its locating marks 205 with those of the first intermediate semi-conductor on insulator substrate 210, thereby its locating marks placed at 0° and 180° are aligned with the locating marks placed at 180° and 0° respectively of the first intermediate semi-conductor on insulator substrate 210. This manipulation has the aim of eliminating any flexion disorientation that may exist between the two surfaces to be assembled. Then, by means of the locating marks 205 with graduations every 0.01°, one may introduce a very precise offset angle in rotation of 0.88° between the two crystalline networks of the films 207 and 213.

Figure 4I:
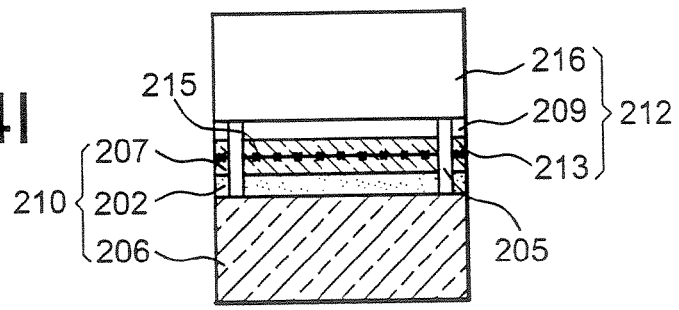
Figure 4J:
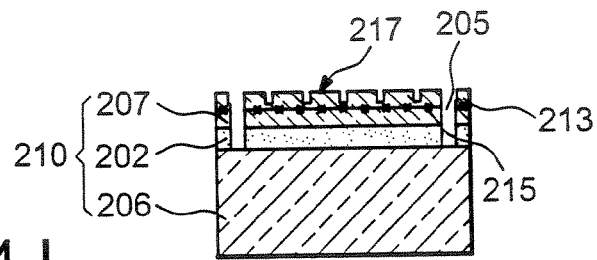

One carries out a molecular bonding for example hydrophobic that one may consolidate by means of a thermal annealing at a temperature above 900° C. for more than 10 minutes. The structure obtained is illustrated in FIG. 4I. The network of crystalline defects and/or stress fields has been generated in the vicinity of the interface 215 as described above.

One is then going to eliminate the thick layer and the insulator layer of one of the intermediate semi-conductor on insulator substrates 210, 212. In the example, it is the second intermediate semi-conductor on insulator substrate 212 that one thins, but one could conceive that it is the other. One only conserves the film of 213.

One is then going to make ordered reliefs 217 on the surface appear on a nanometric scale by attacking preferentially the crystalline defects and/or the stress fields by using for example an aqueous solution of HF and $CrO_3$ or HF and $HNO_3$. The reliefs 217 are visible in FIG. 4J.

One continues an attack operation until reaching the insulator layer 202 of the first intermediate semi-conductor on insulator substrate 210, this latter layer has a role of barrier layer. This deeper attack make take place with the solutions evoked above, or use other aqueous solutions for example based on $NH_3$ and $H_2O_2$ or based on TMAH or KOH. Instead of continuing with a wet chemical attack, it is possible to change over to a dry attack for example of ionic type (known as RIE or reactive ionic etching). On approaching the barrier layer 202, it is preferable to use a type of etching that has a differential attack rate between silicon and its oxide. Thus a chemical etching with TMAH or certain RIE etching has a rate 1000 times higher in silicon than in the oxide. One stops the etching as soon as fragments of the insulator layer 202 are laid bare. One thereby obtains protrusions 227 in crystalline material each formed of a segment of the film 207 of the first intermediate semi-conductor on insulator substrate 210 and a segment of the film 213 of the second intermediate 12 semi-conductor on insulator substrate 2, the two segments being stacked. These protrusions 217 are nanocrystals of silicon that are supported by the layer of oxide 202 of the first intermediate semi-conductor on insulator substrate 210. One may refer to FIG. 4K.

We will now further describe another example of a method according to the invention while referring to FIGS. 5A to 5H. In this example, one is going to employ two intermediate semi-conductor on insulator substrates one of which is a double semi-conductor on insulator substrate, in other words that it comprises an alternated stacking with three layers of semi-conductor material and two layers of insulator and in which the other may be single. One of the external layers of the semi-conductor material of the double semi-conductor on insulator substrate is a crystalline film. In the same way as previously, this crystalline film is going to be assembled by molecular bonding to the crystalline film of the other semi-conductor on insulator substrate so as to generate the network of crystalline defects and/or stress fields.

One begins with a structure as obtained in FIG. 4C with a block 20 of crystalline semi-conductor material for example of silicon, one face of which comprises an oxide layer 202, with a zone 204 embrittled by ion implantation and locating marks 205.

One bonds by hydrophilic molecular bonding the structure of FIG. 4C by its layer of oxide 202 to an auxiliary semi-conductor on insulator substrate 300 formed of a stacking with a layer of silicon 301, a layer of silicon nitride 302 and a film 303 of crystalline silicon. The film 303 of crystalline silicon has a thickness of around 5 nanometres and the layer of silicon nitride 302 a thickness of around 400 nanometres. The assembly is carried out between the layer of oxide of silicon 202 and the film of silicon 303. One may refer to FIG. 5A.

Figure 5A:
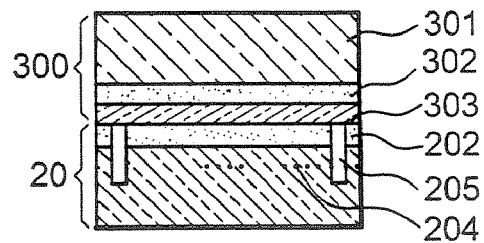
FIGS. 5A to 5H show different steps of the method according to the invention in which one works two semi-conductor on insulator substrates having semi-conductor films stemming from a same block of semi-conductor material, one of said substrates being a double semi-conductor on insulator substrate.
Figure 5B:
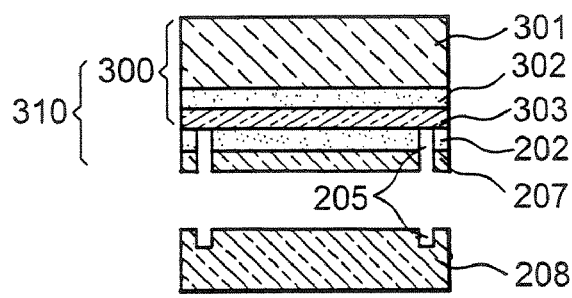

One carries out an annealing operation in order to consolidate the bonding interface 315 and to provoke at the same time the fracture at the level of the embrittled zone 204. One obtains two elements, firstly the double semi-conductor on insulator substrate 310 as illustrated in FIG. 5B formed of the auxiliary semi-conductor on insulator substrate 300, the layer of oxide 202 and a film of silicon 207 stemming from the block 20 and, secondly, the element 208 that corresponds to what remains of the block 20. The locating marks 205 are present in the element 208, in the film 207 and in the layer of oxide 202. One may refer to FIG. 5B.

One is now going to treat element 208 as explained in FIGS. 4F to 4H to obtain the intermediate semi-conductor on insulator substrate 212, which is single. We have not re-written and have not again represented this sequence of steps in order to avoid making the description too unwieldy.

Figure 5C:
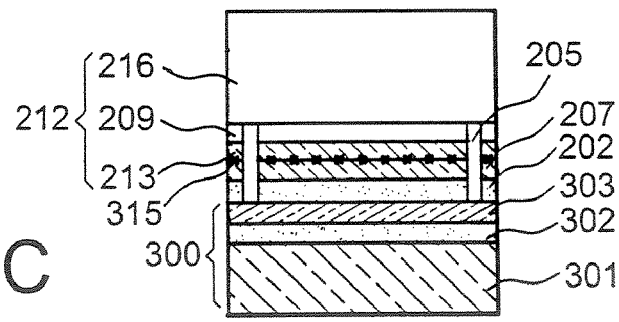
Figure 5D:
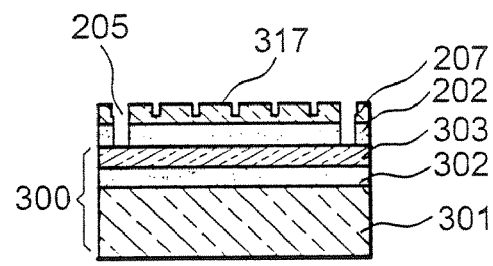
Figure 5E:
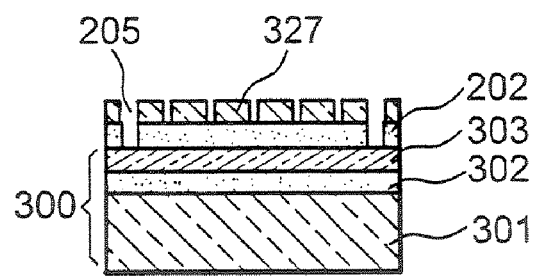
Figure 5F:
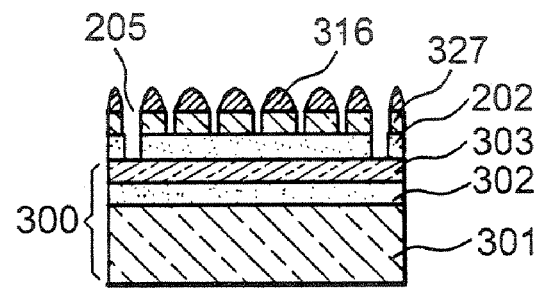
Figure 5G:
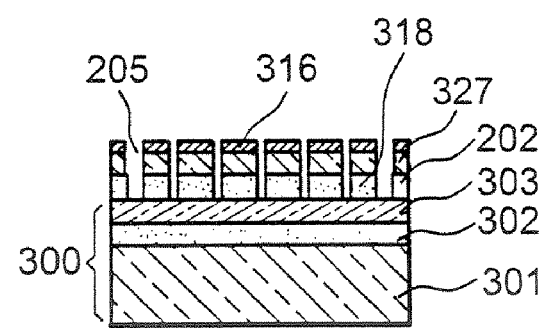
Figure 5H:
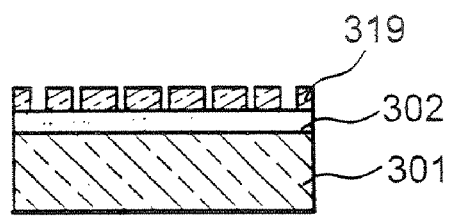

One is now going to assemble the two intermediate semi-conductor on insulator substrates 310, 212 by their films 207, 213 by carrying out a molecular bonding so as to generate the network of crystalline defects and/or stress fields. This step is illustrated in FIG. 5C. One carries out the same type of preparation of the films 213, 207 as described previously. One also carries out the same manipulations before the bonding in order to eliminate any flexion disorientations.

One is going to carry out the elimination of the thick layer 216 and the insulator layer 209 of the single semi-conductor on insulator substrate 212 as explained above for the second intermediate semi-conductor on insulator substrate 212 so as to only conserve its film 213.

One then attacks preferentially the network of crystalline defects and/or stress fields that is formed at the interface 315. This attack may take place as described in FIG. 4J, in other words with an aqueous solution of HF and $CrO_3$, or HF and $HNO_3$. One makes the reliefs 317 that are illustrated in FIG. 5D appear. One continues an attack step to attain the insulator layer 202 in silicon oxide, which serves at this stage as barrier layer. One thereby forms the protrusions 327 that lead to the nanostructures. This attack, illustrated in FIG. 5E, up to the barrier layer 202, may employ the same solutions that one has employed to make the reliefs 31 described in FIG. 4K appear: chemical attack with an aqueous solution based on $NH_3$ and $H_2O_2$ or based on TMAH or KOH, or ionic attack.

Figure 4K:
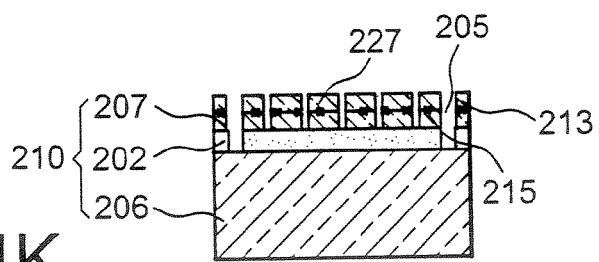
Figure 4L:
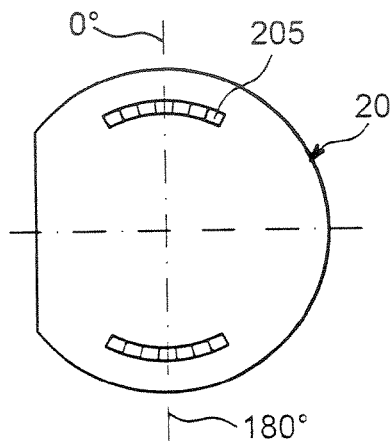

One thereby obtains the protrusions 327 of same nature as those illustrated in FIG. 4K. These protrusions 327, in crystalline material, may materialise the nanostructures if one stops there, but in this specific example, they only contribute to materialising them because one is going to continue to etch in depth the double SOI substrate 310 to attain the insulator layer 302 in silicon nitride. The protrusions 327 are going to serve as etching mask to etch, in the first instance, segments, directly in line with them, in the insulator layer 202 of the double semi-conductor on insulator substrate 310. In order to reinforce the hardness of the mask, it is possible to deposit a metallic film 316, for example of nickel, on the protrusions 327. This deposit can be carried out by sputtering. The film 316 of nickel is also deposited on the insulator layer 202, certain fragments of which are bare. By taking the structure obtained after sputtering of the nickel to a temperature of several hundreds of degrees, the film 316 of nickel dewets and becomes localised in the form of drops at the summit of the protrusions 327. One may refer to FIG. 5F. Nickel has in fact a greater affinity with silicon than with its oxide. By reactive ionic etching, it is possible to etch the insulator layer 202 in oxide. First segments in silicon oxide are contained in the continuation of the protrusions 327, they are referenced 318 in FIG. 5G. One may then follow on with an etching of the underlying layer 303 of semi-conductor material, by changing for example the nature of the gas employed.

The etching of the layer of silicon 303 makes it possible to obtain under the first segments 318, second segments 319 of silicon, the insulator layer 202 that has just been etched serving as mask. The second segments 319 are directly in line with the first segments 318. The underlying layer 302 of silicon nitride serves as barrier layer to this etching step. The second segments 319 in silicon obtained materialise the nanostructures. One then eliminates the film 316 of nickel, the protrusions 327, the first segments 318 of oxide stemming from the layer 202, by chemical or reactive ionic attack. One may for example employ hydrofluoric acid HF, which is only going to dissolve the first segments 318 of oxide stemming from the layer 202 and provoking the removal of the nickel and the protrusions 327 without attacking either the second segments 319 of silicon or the layer 302 of silicon nitride. The summits of all the nanostructures 319 are included in a same plane. The height of the nanostructures 319 is the same, it corresponds to the thickness of the layer of silicon 302. One may refer to FIG. 5H.

Figure 6A:
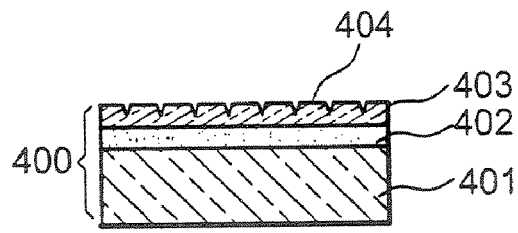
FIGS. 6A to 6G illustrate different steps of another example of the method according to the invention in which a film having a network of crystalline defects and/or stress fields is transferred onto an intermediate substrate covered with a barrier layer.
Figure 6B:
Figure 6C:
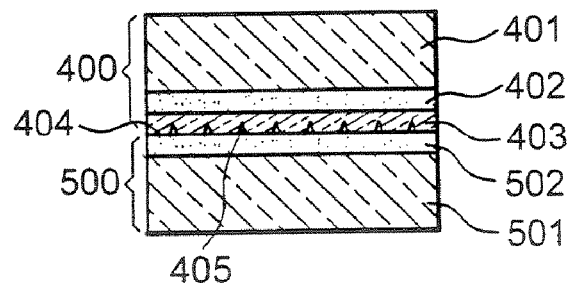

We will now describe, while referring to FIGS. 6A to 6G, another example of a method for producing nanostructures according to the invention. One begins with a first intermediate substrate 400 and a second intermediate substrate 500. The first intermediate substrate 400 illustrated in FIG. 6A is formed of a stacking with a base of silicon 401, an oxide layer of silicon 402 and a film of silicon 403 having at the surface a network of protrusions 404. This first intermediate substrate 400 may be obtained by taking inspiration from the teaching of the patent application FR-A-2 815 121. The second intermediate substrate 500, illustrated in FIG. 6B, is formed of a base 501 covered with a layer 502 of silicon oxide that is going to serve as barrier layer of the substrate 100 that one wishes to obtain. As illustrated in FIG. 6C, one is going to assemble the first intermediate substrate 400 to the second intermediate substrate 500 by bringing into contact the film of silicon 403 provided with the network of protrusions 404 and the barrier layer 502. The assembly may be carried out by hydrophilic molecular bonding for example. The zones in hollows situated between the protrusions of the network are going to generate buried cavities 405 at the level of the bonding interface with the barrier layer 502.

Figure 6D:
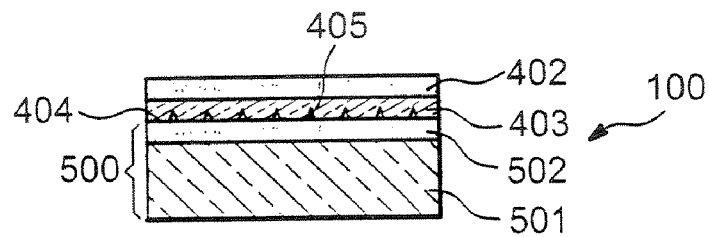

One is then going to eliminate, in FIG. 6D, the base 401 of the first intermediate substrate 400, for example by a mechanical thinning. One obtains the substrate 100 that one is going to provide with nanostructures.

Figure 6E:
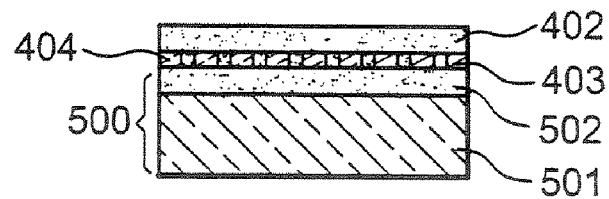

One is going to be able to begin the attacks. In this example, one begins by a thermal oxidation treatment of the silicon of the film 403 bearing the network of protrusions 404. The oxide forms at the interfaces with the layers of oxide 402 and with the barrier layer 502. At the level of the interface with the layer of oxide 502, the oxide forms preferentially at the level of the buried cavities 405 due to the stress induced in these cavities 405 by the thermal treatment. The thermal oxidation may make all or part of these buried cavities 405 disappear. The thermal oxidation leads to the appearance in the film 403 of transversal zones of oxide as illustrated in FIG. 6E.

Figure 6F:
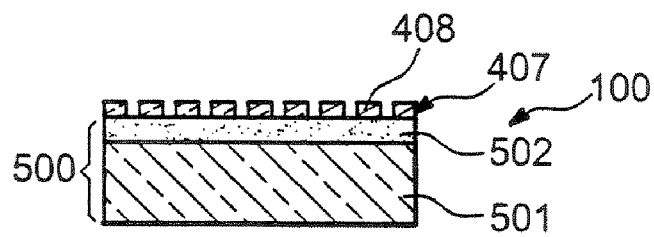
Figure 6G:
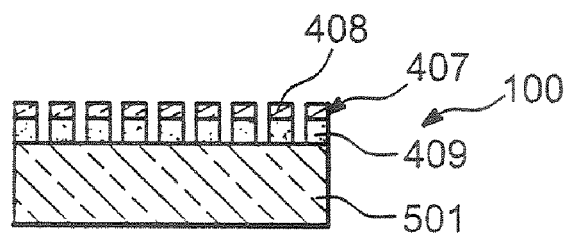

One continues by a preferential etching of the silicon oxide vis-á-vis silicon and one makes appear the protrusions 407 that can form the desired nanostructures as illustrated in FIG. 6F. This etching may continue and descend into the barrier layer 502 directly in line with the spots where were located originally the protrusions of the network 404 as illustrated in FIG. 6G. The protrusions 407 are then formed of first segments 408 in the silicon of the film 403 and second segments 409 in the barrier layer 502. It is possible, as has been explained, to continue the etching in the base 501 of the second intermediate substrate 500 as described in FIG. 5H to obtain third segments (not represented) then to remove the first segments and if necessary the second segments.

Although several embodiments of the present invention have been represented and described in a detailed manner, it will be understood that different changes and modifications may be made without going beyond the scope of the invention. The different embodiments described must be understood as not necessarily being exclusive of each other.

The invention claimed is:

1. A method for making a nanostructured surface, comprising:
   providing a main substrate comprising a base substrate, a superficial crystalline film on top of the base substrate and a barrier layer between the base substrate and the superficial crystalline film, the crystalline film having in a crystalline zone a network of at least one of crystalline defects and stress fields;
   attacking the superficial crystalline film, wherein the attacking preferentially removes the crystalline film at least one of the crystalline defects and the stress fields, or at the crystalline zone,
   wherein the attacking removes the crystalline film at the locations of preferential attack to expose the barrier layer beneath the crystalline film and to form nanometric scale protrusions of the crystalline film on the barrier layer, wherein the protrusions are separated from each other by hollows having a base portion on the barrier layer,
   wherein the nanometric scale protrusions form the nanostructured surface.

2. The method of claim 1, wherein the providing comprises:
   providing a first intermediate substrate having an intermediate crystalline film and an intermediate barrier layer beneath the intermediate crystalline film, and a second intermediate substrate having a crystalline face, said intermediate crystalline film contributing to form the superficial crystalline film of the main substrate and said intermediate barrier layer being the barrier layer of the main substrate;
   bonding by molecular adhesion the intermediate crystalline film of the first intermediate substrate to the crystalline face of the second intermediate substrate,
   wherein during the bonding the crystalline face of the first intermediate substrate and the crystalline face of the second intermediate substrate are oriented to have offset crystalline networks,
   wherein the bonding forms at least one of the crystalline defects and the stress fields in the crystalline zone of the crystalline film, and
   removing at least a portion of the second intermediate substrate bonded to the first intermediate substrate.

3. The method according to claim 1, further comprising:
   transferring the crystalline film having at least one of the crystalline defects and the stress fields onto the barrier layer of the first intermediate substrate.

4. The method of claim 1, further comprising, after the bonding:
   etching an exposed portion of the barrier layer in a pattern corresponding with the nanostructured surface.

5. The method according to claim 4, further comprising:
   covering the protrusions with a material capable of reinforcing the resistance of the protrusions to attack or removal.

6. The method according to claim 4, wherein the etching does not penetrate through the barrier layer.

7. The method according to claim 6, further comprising:
   carrying out the etching on a substrate comprising an additional layer between the base and the barrier layer of the substrate and etching the additional layer in a pattern defined by the protrusions.

8. The method according to claim 7, wherein the etching of the additional layer is stopped by the base.

9. The method according to claim 8, wherein the base portion of the substrate has a multilayer structure comprising a second barrier layer underneath the additional layer.

10. The method according to claim 4, further comprising:
    eliminating the protrusions.

11. The method according to claim 7, further comprising:
    eliminating segments etched into the barrier layer.

12. The method according to claim 5, wherein the additional layer is present in a crystalline semi-conductor material.

13. The method according to claim 1, wherein the attacking is at least one selected from the group consisting of a dry treatment, a wet treatment, a chemical treatment, an ionic treatment, an electrochemical treatment, a photochemical etching, a thermal etching, wherein the attacking is carried out under at least one of oxidizing atmospheric conditions and reducing atmospheric conditions.

14. The method according to claim 1, wherein the attacking is an anisotropic etching to facet the nanostructures.

15. The method according to claim 13, further comprising:
a treating step, wherein the rates of the attacking step and the treating step are different depending on the material attacked or treated.

16. The method according to claim 10, wherein the attacking is an anisotropic etching to transfer a relief pattern formed by the protrusions.

* * * * *